(12) United States Patent
Iwashita et al.

(10) Patent No.: US 9,175,771 B2
(45) Date of Patent: Nov. 3, 2015

(54) PISTON RING

(71) Applicant: TPR CO., LTD., Chiyoda-ku, Tokyo (JP)

(72) Inventors: Takatsugu Iwashita, Tokyo (JP); Tomoyuki Sato, Tokyo (JP)

(73) Assignee: TPR Co., Ltd. (JP)

(*) Notice: Subject to any disclaimer, the term of this patent is extended or adjusted under 35 U.S.C. 154(b) by 0 days.

(21) Appl. No.: 14/610,006

(22) Filed: Jan. 30, 2015

(65) Prior Publication Data

US 2015/0137457 A1    May 21, 2015

Related U.S. Application Data

(63) Continuation of application No. 13/429,934, filed on Mar. 26, 2012, now abandoned.

(30) Foreign Application Priority Data

Mar. 28, 2011 (JP) .................. 2011-069676

(51) Int. Cl.
*F16J 9/26* (2006.01)
*C23C 14/06* (2006.01)
*C23C 28/04* (2006.01)
*C23C 28/00* (2006.01)
*C23C 14/16* (2006.01)

(52) U.S. Cl.
CPC ............... *F16J 9/26* (2013.01); *C23C 14/0605* (2013.01); *C23C 14/16* (2013.01); *C23C 28/044* (2013.01); *C23C 28/44* (2013.01)

(58) Field of Classification Search
CPC .................... F16J 9/26; F16J 9/00; F16J 9/12
See application file for complete search history.

(56) References Cited

U.S. PATENT DOCUMENTS

2008/0220257 A1    9/2008    Dekempeneer
2010/0295251 A1    11/2010   Sekiya et al.
(Continued)

FOREIGN PATENT DOCUMENTS

| DE | 10 2009 046281 | 11/2010 |
|----|----------------|---------|
| EP | 1 760 172 A2   | 3/2007  |
| JP | A-2000-120870  | 4/2000  |

(Continued)

OTHER PUBLICATIONS

Japanese Office Action for corresponding JP Application No. 2011-069676 (Feb. 21, 2014).
(Continued)

*Primary Examiner* — Gilbert Lee
(74) *Attorney, Agent, or Firm* — Merchant & Gould P.C.

(57) ABSTRACT

A piston ring which is provided with a carbon-based coating which has a low friction property and wear resistance, that is, a piston ring which has a carbon-based coating formed over its sliding surface, in which piston ring, the coating is a multilayer coating comprised of two types of layers having different hardnesses laminated in at least two layers, a hardness difference between the two types of layers is 500 to 1700 HV, a high hardness layer has the same or greater thickness than a low hardness layer, and the coating as a whole has a thickness of 5.0 μm or more. The high hardness layer has a thickness of 5 to 90 nm. The surface on which the coating is formed has a base material roughness of 1.0 μmRz or less.

5 Claims, 2 Drawing Sheets

(56) References Cited

U.S. PATENT DOCUMENTS

| | | |
|---|---|---|
| 2012/0205875 A1 | 8/2012 | Kennedy et al. |
| 2013/0042845 A1 | 2/2013 | Kennedy et al. |

FOREIGN PATENT DOCUMENTS

| | | |
|---|---|---|
| JP | A-2000-170594 | 6/2000 |
| JP | A-2002-322555 | 11/2002 |
| JP | A-2006-008853 | 1/2006 |
| JP | A-2007-070667 | 3/2007 |
| JP | A-2007-278314 | 10/2007 |
| JP | A-2008-286354 | 11/2008 |
| JP | A-2011-522965 | 8/2011 |
| JP | A-2013-501897 | 1/2013 |
| WO | WO 2007/020139 | 2/2007 |
| WO | WO 2009/151404 A1 | 12/2009 |
| WO | WO 2011/018252 | 2/2011 |
| WO | WO 2011/018252 A1 | 2/2011 |
| WO | WO 2011/051008 | 5/2011 |

OTHER PUBLICATIONS

Notification of Third Party Submission for EP Application No. 12157919.7 (May 22, 2013).

Search Report mailed May 23, 2012 for corresponding European Patent Application No. 12157919.7, 4 pgs.

Office Action for Chinese Patent Application No. 201210085186.6 (Feb. 28, 2015).

PISTON RING

This application is a continuation of U.S. patent application Ser. No. 13/429,934 filed Mar. 26, 2012, which claims the benefit of priority Japanese Patent Application 2011-069676 filed Mar. 28, 2011, the disclosures of all of which are hereby incorporated by reference in their entireties. To the extent appropriate, a claim of priority is made to the above disclosed applications.

BACKGROUND OF THE INVENTION

1. Field of the Invention

The present invention relates to a piston ring for an internal combustion engine.

2. Description of the Related Art

A carbon-based coating is known as a coating which has a low coefficient of friction, but the coating stress is high and self fracture occurs, so increasing the thickness is difficult. Japanese Patent Publication (A) No. 2006-008853 proposes a carbon-based coating with a low coefficient of friction which is made a multilayer structure with a surface-most layer comprised of a soft layer and with soft layers and hard layers alternately laminated and which enables a smooth surface to be easily obtained.

See the above Japanese Patent Publication (A) No. 2006-008853 for the related art.

Japanese Patent Publication (A) No. 2006-008853 does not define the hardness difference between the hard layer and the soft layer. However, in Japanese Patent Publication (A) No. 2006-008853, the soft layer is meant as a fitting layer, while the hard layer is meant as a wear resistance layer, so the hardnesses are, in Example 1, soft layer: 18 GPa and hard layer: 42 GPa and, in Example 2, soft layer: 20 GPa and hard layer: 41 GPa. The hardness difference between the soft layer and hard layer was large.

SUMMARY OF THE INVENTION

An object of the present invention is to provide a piston ring which is provided with a carbon-based coating which has a low friction property and excellent wear resistance.

The present invention provides a piston ring which has a carbon-based coating formed over its sliding surface, in which piston ring, the coating is a multilayer coating comprised of two types of layers having different hardnesses laminated in at least two layers each, a hardness difference between the two types of layers is 500 to 1700 HV, a high hardness layer has the same or greater thickness than a low hardness layer, and the coating as a whole has a thickness of 5.0 µm or more.

Preferably, the high hardness layer has a thickness of 5 to 90 nm.

Preferably, the surface on which the coating is formed has a base material roughness of 1.0 µmRz or less.

Preferably, a surface-most layer of the coating is a high hardness layer.

Preferably, a low hardness layer of the coating contains carbon alone or carbon and also Cr or Ti.

Summarizing the advantageous effects of the invention, according to the piston ring of the present invention, by making the carbon-based coating a multilayer coating of two types of layers which have a hardness difference of 500 to 1700 HV, increasing the thickness becomes possible and both a low friction property and excellent wear resistance are given. If the hardness difference is less than 500 HV, coating cracks cause the sliding surface to become rough, the coefficient of friction to become larger, and the wear of the opposing material to become greater as well. If the hardness difference becomes larger than 1700 HV, sliding causes the low hardness layer to become worn, stress concentrates at the surface relief parts of the high hardness layer (see FIG. 1B), the coating chips, the coefficient of friction becomes larger, and wear at the opposing material also becomes greater. If the overall thickness of the coating is less than 5.0 µm, the wear resistance becomes insufficient.

BRIEF DESCRIPTION OF THE DRAWINGS

These and other objects and features of the present invention will become clearer from the following description of the preferred embodiments given with reference to the attached drawings, wherein FIGS. 1A to 1C show an embodiment of the present invention, wherein FIG. 1A is a longitudinal cross-sectional view which shows one part of a piston ring, FIG. 1B is an enlarged cross-sectional view of a coating part, and FIG. 1C is a view which shows one part of a coating surface after sliding.

DESCRIPTION OF PREFERRED EMBODIMENTS

Figure 1A:
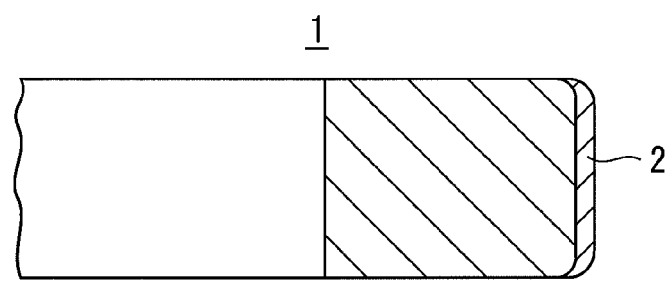

Below, a preferred embodiment of the present invention will be explained while referring to the drawings.

Figure 1C:
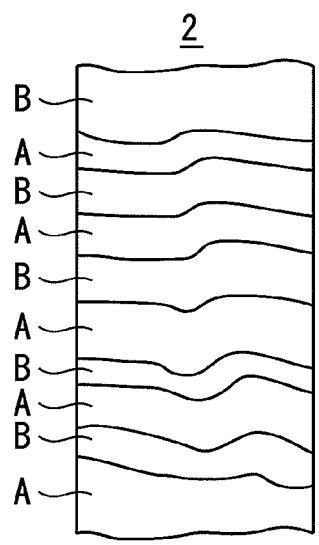
Figure 1B:
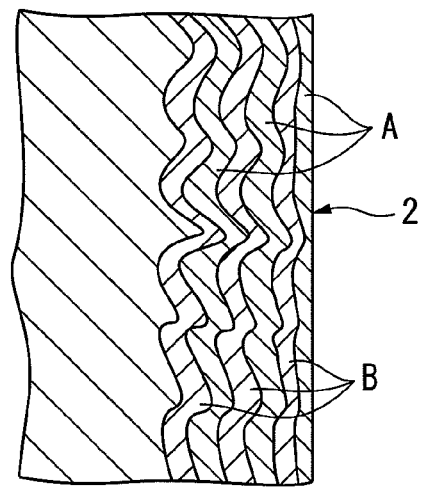

A piston ring 1 has a carbon-based coating 2 formed on its outer circumference. The carbon-based coating 2 is a DLC (diamond-like carbon) coating comprised of a multilayer coating of two types of layers A and B with different hardnesses laminated in at least two layers each. In FIGS. 1A to 1C, the two types of layers A and B are laminated in six layers each. The surface-most layer is a layer A with a high hardness. The hardness difference between the two types of layers A and B is 500 to 1700 HV. The layer A with the high hardness (hereinafter referred to as the "high hardness layer A") has a thickness of 5 to 90 nm, while the layer B with a low hardness (hereinafter referred to as the "low hardness layer B") has the same or greater thickness. The overall thickness of the carbon-based coating 2 is 5.0 μm or more. The base material roughness of the outer circumference is 1.0 μmRz or less. The low hardness layer B may contain Cr or Ti. If Cr or Ti is contained, the adhesion with the high hardness layer A is improved more.

If the thickness of the high hardness layer A is smaller than 5 nm, the required widths of the high hardness layer A and the low hardness layer B which are exposed at the outer circumference after sliding (see FIG. 1C) cannot be sufficiently secured, the oil retention property falls, and the low friction effect becomes insufficient. If the thickness becomes larger than 90 nm, the widths of the high hardness layer A and the low hardness layer B which are exposed at the outer circumference after sliding become too great, coating cracks occur, the coefficient of friction becomes greater, and the wear of the opposing material also becomes greater. If the base material roughness of the outer circumference is larger than 1.0 μmRz, sliding causes the low hardness layer B to wear, stress to concentrate at surface relief parts of the high hardness layer A (see FIG. 1B), the coating to chip, the coefficient of friction to become greater, and the wear of the opposing material to also become greater. If the surface-most layer is a high hardness layer A, the surface of the opposing material can be quickly smoothened.

The above carbon-based coating 2 is formed using the PVD method by alternate sputtering (forming low hardness layer B) and ion plating (forming high hardness layer A). The thicknesses of the layers are adjusted by changing the formation times, while the hardnesses are adjusted by changing the bias voltage.

Below, the results of use of a reciprocating wear tester to measure the self wear amount, opposing wear amount, and coefficient of friction will be explained.

Figure 2:
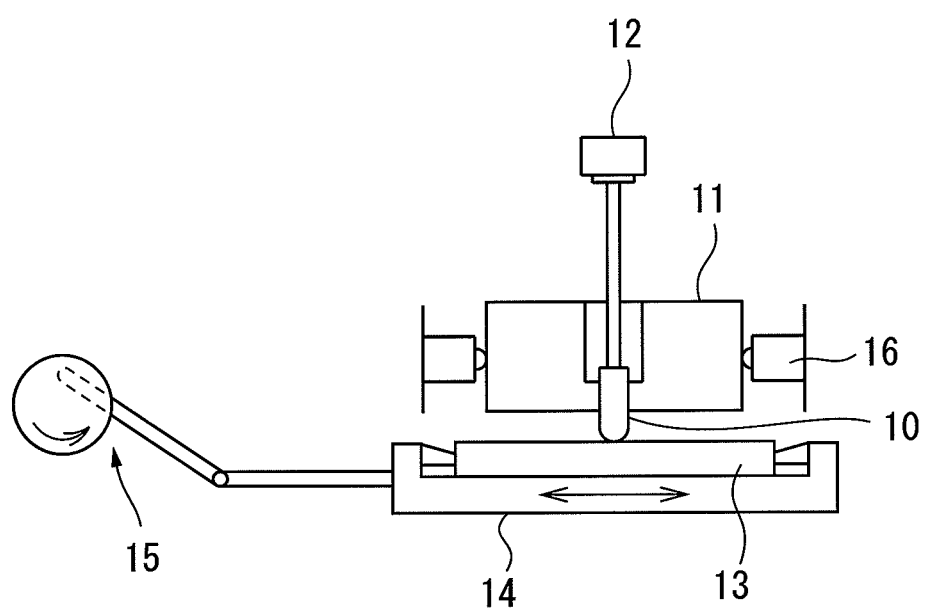
FIG. 2 is a schematic view of a reciprocating wear tester.

FIG. 2 shows an outline of a reciprocating wear tester which is used for the test. A pin-shaped top test piece 10 is held by a holding block 11. From above, a hydraulic cylinder 12 is used to apply a downward load whereby a bottom test piece 13 is pressed against. On the other hand, a flat disk shaped bottom test piece 13 is held by a movable block 14 and is made to move back and forth by a crank mechanism 15. Reference numeral 16 indicates a load cell.

The test conditions were as follow:

Load: 100N

Speed: 600 cpm/min

Lubrication oil: 5W-20

Time: 1 hour

Top test piece: pin-shaped test piece for piston ring given DLC coating

Bottom test piece: flake shaped graphite cast iron material for cylinder liner

TABLE 1

| | A layer hardness HV | B layer hardness HV | A, B layer hardness difference HV | Elements of B layer other than C | Base material roughness μmRz | A layer thickness nm | Self wear μm | Opposing wear μm | Coefficient of friction |
|---|---|---|---|---|---|---|---|---|---|
| Ex. 1 | 2000 | 300 | 1700 | — | 0.2 | 5 | 0.5 | 1 | 0.04 |
| Ex. 2 | 1900 | 1400 | 500 | — | 0.3 | 20 | 0.5 | 1 | 0.04 |
| Ex. 3 | 2700 | 1000 | 1700 | — | 0.2 | 30 | 0.5 | 1 | 0.04 |
| Ex. 4 | 1700 | 400 | 1300 | — | 0.2 | 90 | 0.5 | 1 | 0.04 |
| Ex. 5 | 2500 | 1000 | 1500 | Cr | 0.3 | 80 | 0.5 | 1 | 0.04 |
| Ex. 6 | 1700 | 400 | 1300 | — | 0.5 | 10 | 0.5 | 1 | 0.04 |
| Ex. 7 | 1700 | 400 | 1300 | — | 1.0 | 10 | 0.5 | 1 | 0.04 |
| Comp. Ex. 1 | 1800 | 1400 | 400 | — | 0.2 | 90 | Coating breaks | 5 | 0.09 |
| Comp. Ex. 2 | 2800 | 1000 | 1800 | — | 0.3 | 90 | 2.0 | 4 | 0.07 |
| Comp. Ex. 3 | 1900 | 1400 | 500 | — | 0.3 | 3 | 0.5 | 1 | 0.06 |
| Comp. Ex. 4 | 1700 | 300 | 1400 | — | 0.2 | 110 | 2.0 | 5 | 0.09 |
| Comp. Ex. 5 | 2000 | 300 | 1700 | — | 0.2 | 3 | 0.5 | 1 | 0.07 |
| Comp. Ex. 6 | 1700 | 400 | 1300 | — | 1.2 | 10 | 1.5 | 2 | 0.07 |

While the invention has been described with reference to specific embodiments chosen for purpose of illustration, it should be apparent that numerous modifications could be made thereto by those skilled in the art without departing from the basic concept and scope of the invention.

The invention claimed is:

1. A piston ring for sliding, via an engine lubrication oil, against a flake shaped graphite iron material for a cylinder liner of a cylinder of an internal combustion engine, which piston ring has a diamond-like carbon (DLC) coating formed over its sliding surface, in which piston ring, said coating is a multilayer coating comprised of two types of layers having different hardnesses alternately laminated in at least two layers, a hardness difference between said two types of layers is 500 to 1700 HV, a high hardness layer has the same or greater thickness than a low hardness layer, a surface most layer of the coating is the high hardness layer, and the coating as a whole has a thickness of 5.0 μm or more.

2. A piston ring as set forth in claim 1, wherein said high hardness layer has a thickness of 5 nm or more.

3. A piston ring as set forth in claim 2, wherein the surface on which said coating is formed has a base material roughness of 1.0 μmRz or less.

4. A piston ring as set forth in claim 1, wherein the surface on which said coating is formed has a base material roughness of 1.0 μmRz or less.

5. A piston ring as set forth in claim 1, wherein a low hardness layer of said coating contains carbon alone or carbon and also Cr or Ti.

\* \* \* \* \*